United States Patent
Katsumura et al.

(10) Patent No.: US 9,707,614 B2
(45) Date of Patent: Jul. 18, 2017

(54) TUBE EXPANDING METHOD FOR MANUFACTURING METAL TUBE

(75) Inventors: Tatsuro Katsumura, Aichi (JP); Noritsugu Itakura, Tokyo (JP); Seiichiro Nambu, Chengdu (CN); Kazutoshi Ishikawa, Aichi (JP)

(73) Assignee: JFE Steel Corporation (JP)

(*) Notice: Subject to any disclaimer, the term of this patent is extended or adjusted under 35 U.S.C. 154(b) by 310 days.

(21) Appl. No.: 14/404,241

(22) PCT Filed: May 29, 2012

(86) PCT No.: PCT/JP2012/064345
§ 371 (c)(1),
(2), (4) Date: Nov. 26, 2014

(87) PCT Pub. No.: WO2013/179496
PCT Pub. Date: Dec. 5, 2013

(65) Prior Publication Data
US 2015/0114073 A1 Apr. 30, 2015

(51) Int. Cl.
*B21D 39/20* (2006.01)
*B21D 41/02* (2006.01)
*G06F 17/50* (2006.01)
*B21C 1/24* (2006.01)
*B21C 3/16* (2006.01)

(52) U.S. Cl.
CPC ............ *B21D 39/20* (2013.01); *B21C 1/24* (2013.01); *B21C 3/16* (2013.01); *B21D 41/026* (2013.01); *G06F 17/5018* (2013.01)

(58) Field of Classification Search
CPC ........ B21D 39/20; B21D 15/06; B21D 41/02; B21C 37/30; B21C 1/24; B21C 3/16; G06F 17/5009; G06F 17/5018
See application file for complete search history.

(56) References Cited

U.S. PATENT DOCUMENTS

2006/0218985 A1* 10/2006 Kenmochi ............... B21C 1/26
72/284
2010/0170316 A1* 7/2010 Okui ......................... B21C 3/16
72/283

FOREIGN PATENT DOCUMENTS

| JP | 61-56746 | 3/1986 |
| JP | 62-24827 | 2/1987 |
| JP | 62-24828 | 2/1987 |
| JP | 2001-113329 | 4/2001 |
| JP | 2001-508144 | 6/2001 |
| JP | 2001-300659 | 10/2001 |

(Continued)

OTHER PUBLICATIONS

Supplementary European Search Report dated Nov. 17, 2015 of corresponding European Application No. 12877718.2.

*Primary Examiner* — Moshe Wilensky
*Assistant Examiner* — Mohammad Yusuf
(74) *Attorney, Agent, or Firm* — DLA Piper LLP (US)

(57) ABSTRACT

Through a tube expanding processing simulation, a workpiece shape in a state where a tip of a workpiece 10 has advanced by 1.0 m or more after passing through a shoulder portion 3 of a tool 1 is evaluated. A hollow piece shape and a tool shape such that the external diameter is within ±1% of the target, the thickness is within ±7.5% of the target, and the internal gap between the hollow piece and the tool is 1.0 mm or less are obtained by repeated calculation, and thereby actual tube expanding manufacturing conditions are determined.

8 Claims, 3 Drawing Sheets

(56) References Cited

FOREIGN PATENT DOCUMENTS

| | | |
|---|---|---|
| JP | 2009-90352 | 4/2009 |
| WO | 98/00626 | 10/1998 |
| WO | 2011/016434 | 2/2011 |

* cited by examiner

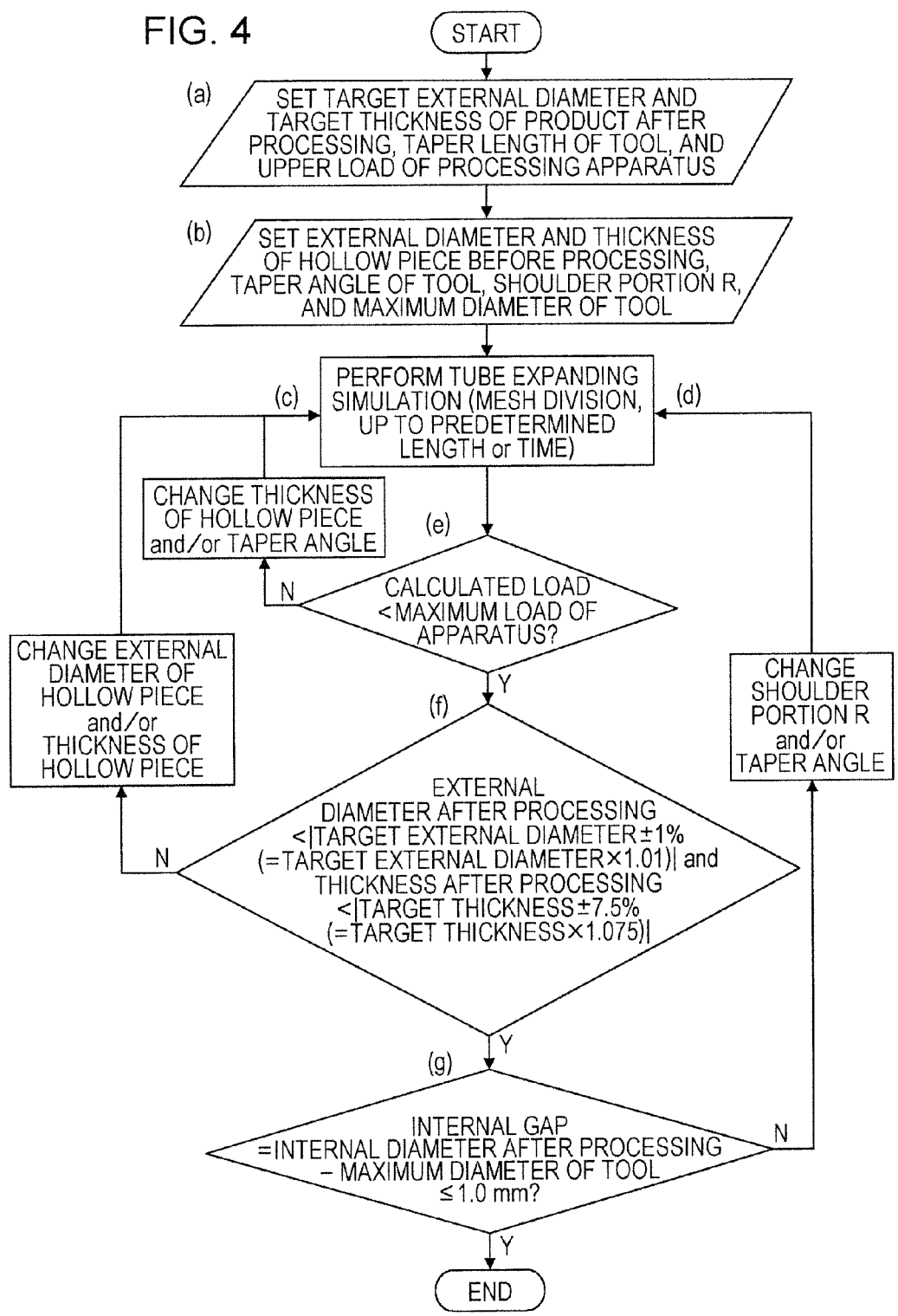

TUBE EXPANDING METHOD FOR MANUFACTURING METAL TUBE

TECHNICAL FIELD

This disclosure relates to a tube expanding method for manufacturing a metal tube and, more specifically, it relates to a tube expanding method for manufacturing a metal tube such that when a metal tube manufactured by tube rolling or the like is used as a hollow piece, the hollow piece is passed through an internal processing tool and/or mandrel bar or plug, and thereby a metal tube having a diameter larger than that of the hollow piece is manufactured, appropriate manufacturing conditions of tube expanding method can be advantageously determined through simulation.

BACKGROUND

Metal tubes are roughly classified according to manufacturing method as welded tubes or seamless tubes. A welded tube is manufactured using a metal sheet as a material, by forming this metal sheet into an arc-like shape by press or roll, and joining both ends of the arc by welding into a tubular shape. A seamless tube is manufactured by rendering a solid metal blank or a billet hollow by rolling or extrusion so that it has a desired size. Either is selected according to facility type. However, when pressure is applied to the inside surface of a tube, and damage by tube breaking has a critical influence on the facility, a seamless tube is generally used.

Examples of such a facility include steam pipework and heat exchanger tubing in generating power plants and atomic power plants. In recent years, the temperature has been increased for the purpose of improving power generation efficiency, small-diameter metal tubes for heat exchange have been required to have high quality, and steam pipework needs to deal with high flow (to have a large diameter).

In methods of manufacturing seamless tubes, the upper limit of the diameter of the tube manufactured has been about 400 mm. For this reason, when a metal tube having a larger diameter is needed, a once-manufactured tube is expanded again by a method such as rolling.

Tube expanding methods include a method such that tube expansion is performed using a tool placed between a plurality of mill rolls (referred to as method A for the sake of convenience). Although that method is suitable to mass manufacture products having a specific size, it has the following disadvantages. For example, the facility cost is high, and scratches are prone to be generated on the outer surface of the tube due to contact with the rolls. Thus, that method is not widely used.

Tube expanding methods also include a method such that a tool is placed on the internal diameter side, and a tube is extruded (for example, Japanese Unexamined Patent Application Publication No. 61-56746) or drawn to the large diameter side of the tool (referred to as method B for the sake of convenience). That tube expanding method can be performed in both heated and non-heated manners. When the thickness of a tube after tube expansion is to be reduced to about 5% of the external diameter, it is performed in a heated manner from the viewpoint of production efficiency. That method has the advantage that power can be saved from the viewpoint of processing, and the degree of freedom of tube size is relatively high. On the other hand, a certain level of skill or experience is required to manufacture with this method. The reason is as follows. In the above-mentioned method A, the external diameter side can be fixed with the roll, and the internal diameter side can be fixed with the tool, and thus the size of finished product can be easily achieved. In the method B, since there is no tool on the external diameter side, the flexibility of deformation is high, and not only the external diameter but also the thickness and the internal diameter cannot be determined. Thus, determining the forming conditions such as tool shape is generally difficult.

To eliminate defects of products caused by such high flexibility of deformation, a tool shape that can reduce the bentness of products has been proposed (for example, Japanese Unexamined Patent Application Publication No. 2001-113329).

However, in Japanese Unexamined Patent Application Publication No. 2001-113329, there is no technical disclosure of the basic point of how to manufacture the product having a predetermined product dimension. In other words, on the premise that conditions of forming for a predetermined size product are known, Japanese Unexamined Patent Application Publication No. 2001-113329 only states that it is effective to change the tool shape.

Thus, in the method B (method such that the internal diameter side of a tube is passed through a tool by pressing or drawing the tube end), determining the manufacturing conditions such as an appropriate tool shape and/or hollow piece size according to arbitrary product dimension requires many trial productions and tests, and is extremely difficult and not economic. This is a great disadvantage. For this reason, it is difficult to reflect customer needs, and method B is not widely used.

It could therefore be helpful to provide a tube expanding method for manufacturing a metal tube, including passing the internal diameter side through a tool by pressing or drawing the tube end of a metal tube, wherein to obtain a finished product having an arbitrary size, manufacturing condition of tube expanding method (tool shape, hollow piece size) such that the analysis result falls within a specific limited range is obtained using simulation, and thereby an increase in product dimension, a reduction in testing time and cost reduction which have been problems in manufacturing, and industrialization can be easily achieved.

Although the manufacturing method and chemical composition of a metal tube used in our tube expanding method are not particularly limited, the metal tube shown below is particularly preferable.

(1) JISG 3458 alloy steel pipe for piping (STPA20, STPA22 to 26) (corresponding to ASTM A335, ASTM A405, BS 3604, DIN 17175, DIN 17177):

The preferred composition range is, C: 0.10-0.15%, Si: 0.10-1.00%, Mn: 0.30-0.80%, P: 0.035% or less, S: 0.035% or less, Mo: 0.40-1.10%, Cr: 0% or 0.50-10.00%. As necessary, Cu: 1% or less, Ni: 2% or less, Nb: 0.1% or less, V: 0.5% or less, Ti: 0.2% or less, B: 0.005% or less, REM: 0.02% or less, Ca: 0.01% or less can be added. As unavoidable impurities, N: 0.010% or less, O: 0.006% or less are permissible. In terms of manufacturing method, a seamless steel tube manufactured by Mannesmann type piercing is preferable.

(2) JISG 3462 alloy steel pipe for boiler and heat-exchange (STBA12 to 13, STBA20, STBA22 to 26) (corresponding to ISO 9329-2:1997, ISO 9330-2:1997, ASTM A161, A199, A179 A200, A209, A213, A250, A423, BS 3059, DIN 17175, DIN 17177):

Preferable composition range is, C: 0.10-0.20%, Si: 0.10-1.00%, Mn: 0.30-0.80%, P: 0.035% or less, S: 0.035% or less, Mo: 0.40-1.10%, Cr: 0% or 0.50-10.00%. As necessary, Cu: 1% or less, Ni: 2% or less, Nb: 0.1% or less, V: 0.5% or less, Ti: 0.2% or less, B: 0.005% or less, REM: 0.02% or less, Ca: 0.01% or less can be added. As unavoidable impurities, N: 0.010% or less, and O: 0.006% or less are permissible. In terms of manufacturing method, a seamless steel tube manufactured by Mannesmann type piercing, or an electric resistance welded steel pipe manufactured by electric resistance welding using high-frequency current is preferable.

SUMMARY

We thus provide:

(1)

A tube expanding method for manufacturing a metal tube such that, to an internal processing tool having a taper portion, a shoulder portion, and a parallel portion that are smoothly connected each other in this order from a starting end that is the minimum diameter end of the tool to a terminal end that is the maximum diameter end of the tool, a metal tube that is a workpiece whose hollow piece internal diameter is smaller than the diameter of the parallel portion, that is, the maximum diameter of the tool is fed, the starting end side of the tool being used as an entrance side, the internal diameter side of the tube is caused to pass through the tool, and thereby the workpiece undergoes tube expanding processing, wherein size of the hollow piece that is the workpiece before tube expanding processing, and size of the tool are determined by the following procedure through a tube expanding processing simulation based on the finite element analysis:

(a) a target external diameter and a target thickness of a product, a length of the taper portion of the tool, and an upper load that is the upper limit of feed power of a tube expanding processing apparatus to be used are set;

(b) as size parameters, an external diameter of the hollow piece, a thickness of the hollow piece, a taper angle that is a taper angle of the taper portion of the tool, a shoulder portion R that is a radius of curvature of the shoulder portion in the axial section of the tool, and the maximum diameter of the tool that is the diameter of the parallel portion of the tool are set;

(c) the workpiece is divided into a plurality of elements;

(d) tube expanding processing simulation is performed, and a calculated load that is a calculated feed power, and an external diameter after processing, a thickness after processing, and an internal diameter after processing of the workpiece when a tip of the workpiece has advanced by 1.0 m or more from the shoulder portion position toward a tool exit side are obtained;

(e) it is determined whether or not the calculated load is less than or equal to the upper load; if the determination result is Yes, step (f) is proceeded to; if it is No, the thickness of the hollow piece, or the thickness of the hollow piece and the taper angle are changed, and step (c) is returned to;

(f) it is determined whether or not the external diameter after processing is within a range of the target external diameter ±1% and the thickness after processing is within a range of the target thickness ±7.5%; if the determination result is Yes, step (g) is proceeded to; if it is No, the external diameter of the hollow piece and/or the thickness of the hollow piece is changed, and step (c) is returned to; and (g) it is determined whether or not an internal gap=the internal diameter after processing−the maximum diameter of the tool is 1 mm or less; if the determination result is Yes, the size parameters at this time are determined to be size parameters for actual tube expanding manufacturing, and the procedure is ended; if it is No, the shoulder portion R and/or the taper angle is changed, and step (c), (d) is returned to.

(2)

The tube expanding method for manufacturing a metal tube according to (1), wherein while the internal diameter side of the tube is caused to pass through the tool, part of the workpiece passing through the taper portion to a corresponding part at the upstream side is heated from the external diameter side to a predetermined temperature at the taper portion position.

(3)

The tube expanding method for manufacturing a metal tube according to the above (1) or (2), wherein the hollow piece is a seamless tube.

(4)

The tube expanding method for manufacturing a metal tube according to any one of (1) to (3), wherein the tube expanding processing simulation is performed using ABAQUS, which is a commercial analysis code, by the two-dimensional finite element method using the dynamic explicit method.

An appropriate manufacturing condition of tube expanding method can be determined by thought experiment based on simulation and concise logic and, thus, compared to conventional methods in which the above-mentioned determination is impossible without multitude levels of trial production and tests that rely on experience, a significant reduction in trial production process and a reduction in time until the manufacturing of products are achieved.

BRIEF DESCRIPTION OF THE DRAWINGS

FIG. 4 is a flow chart showing the procedure of tube expanding processing simulation.

Figure 1A:
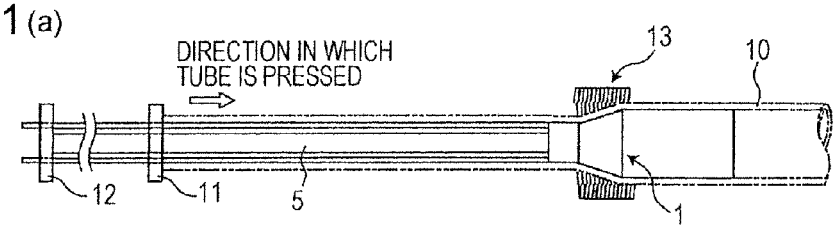
FIGS. 1(a) and (b) are schematic views showing an example of a tube expanding manufacturing apparatus used our methods.

REFERENCE SIGNS LIST 1 tool (internal processing tool)
2 taper portion
3 shoulder portion
4 parallel portion
5 mandrel
10 workpiece (metal tube)
11 pipe pushing means
12 tool support means
13 induction coil

DETAILED DESCRIPTION

Our methods will be described below in detail.

Our methods are is based on the premise that it is a tube expanding method for manufacturing a metal tube such that, to an internal processing tool having a taper portion, a shoulder portion and a parallel portion that are smoothly connected each other in this order from a starting end that is the minimum diameter end of the tool to a terminal end that is the maximum diameter end of the tool, a metal tube that is a workpiece whose hollow piece internal diameter is smaller than the diameter of the parallel portion, that is, the maximum diameter of the tool is fed to the starting end side of the tool, the internal diameter side of the tube is caused to pass through the tool, and thereby the workpiece undergoes tube expanding processing. This premise itself is known.

This premise also includes when, while the internal diameter side of the tube is caused to pass through the tool, part of the workpiece passing through the taper portion is heated from the external diameter side.

Figure 1B:
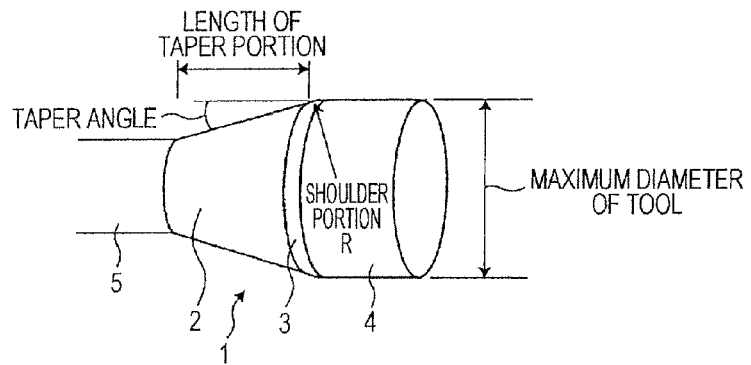

FIGS. 1(a) and (b) show an example of a tube expanding processing apparatus used in the above-mentioned tube expanding processing. As shown in FIG. 1 (b), a tool (internal processing tool) 1 has a taper portion 2, a shoulder portion 3, and a parallel portion 4 smoothly connected to each other in this order from a starting end that is the minimum diameter end to a terminal end that is the maximum diameter end. As shown in FIG. 1 (a), the tool 1 is supported by a tool support means 12 with a mandrel 5 connected to the starting end side therebetween, and its position is fixed. A workpiece (metal tube) 10 has, in of a hollow piece before processing, an internal diameter smaller than the maximum diameter the tool that is the external diameter of the parallel portion of the tool 1, and is fed to the tool 1 from the starting end side of the tool 1 as the entrance side. As the feeding means, in this example, a pusher 11 that presses the tube from the entrance side of the tool is provided. This causes the internal diameter side of the workpiece 10 to pass through the tool 1. Instead of the pusher 11 of this example that presses the tube from the entrance side of the tool, a drawer (not shown) that draws the tube from the exit side of the tool may be used as a feeding means.

This example shows a case where the above-mentioned heating is performed. At the taper portion position, an induction coil 13 serving as a heating device is placed to surround the passage of the workpiece 10, and this heats the material portion passing through the taper portion position from the external diameter side. The heating device is not limited to an induction coil 13 and may be a burner. Instead of the above-mentioned heating, the hollow piece may be pre-heated in a furnace or the like. The heating may be performed at the upstream side of the aforesaid heating position to secure a predetermined temperature at the taper portion position.

In an actual tube expanding processing, the above-mentioned heating is generally performed. The location of the heating device is a region including the tool 1, and the desirable length of the region is at least about 500 mm, and ideally about 2000 mm.

Unlike the conventional method, the size of a hollow piece that is a workpiece before tube expanding processing, and the size of the above-mentioned tool are determined by a particular procedure through a tube expanding processing simulation based on the finite element analysis. This procedure will be described below with reference to FIG. 4. In the following description, when the hollow piece is a seamless tube and the above-mentioned heating is performed during tube expanding processing is assumed. Here, seamless tube means a hollow body made from a billet or bloom that is circular or square in cross-section by a rolling method or extrusion method, or a hollow body that has further undergone tube rolling.

First, in step (a), the target external diameter, target thickness, and target internal diameter of the product, the length of the taper portion of the tool, and the upper load that is the upper limit of the feed power of the tube expanding processing apparatus to be used are set.

(Preferable Setting)

The target external diameter, the target thickness, and the upper load of the tube expanding processing apparatus=predetermined values.

The length of the taper portion of the tool the length region of the above-mentioned heating device.

Next, in step (b), as size parameters, the external diameter of the hollow piece, the thickness of the hollow piece, the taper angle that is the taper angle of the taper portion of the tool, the shoulder portion R that is the radius of curvature of the shoulder portion in the axial section of the tool, and the maximum diameter of the tool that is the diameter of the parallel portion of the tool are set. That is, initial values are assigned to these size parameters.

(Preferable Setting)

The external diameter of the hollow piece≈400 mm, which is generally the upper limit of external diameter of seamless tubes. However, to reduce the difference between the external diameters before and after processing, the external diameter of the hollow piece may be less than 400 mm.

The thickness of the hollow piece the match solution between the cross-sectional area of the product and the cross-sectional area of the hollow piece (solution such that the cross-sectional area of the product is equal to the cross-sectional area of the hollow piece).

The taper angle≈ arctan (((the internal diameter of the product−the internal diameter of the hollow piece)/2)/the length of the taper portion). In this expression, the maximum diameter of the tool may be substituted for the internal diameter of the product.

The maximum diameter of the tool the internal diameter of the product+the amount of thermal expansion due to the above-mentioned heating.

The internal diameter of the product=target external diameter−2*target thickness.

The shoulder portion R the external diameter of the hollow piece to twice this.

Next, step (c) divides the workpiece into a plurality of elements. At this time, from the viewpoint of analysis accuracy, each element in the processed part (part passing through the taper portion) is preferably a rectangle element such that in a cross-section along the longitudinal direction of the tube, the size Δd along the thickness direction of the tube is 5 mm or less, and the size ΔL along the longitudinal direction of the tube is equal to or smaller than twice Δd. From the perspective of time-saving, Δd is preferably 1 mm or more, and ΔL is preferably 0.5 times Δd or more. The parts other than the processed part are preferably divided in the same manner as the processed part. However, if the calculating time is too long, the division number may be reduced (the element size may be increased). Analysis by the three-dimensional finite element method is time-consuming and expensive but highly accurate and, thus, this may be used.

Next, step (d) performs tube-expanding processing simulation, and the calculated load that is the calculated feed power, and the external diameter after processing, the thickness after processing, and the internal diameter after processing of the workpiece at the time when the tip of the workpiece has advanced by the distance of 1.0 m or more from the shoulder portion position toward the tool exit side are obtained.

Simulation based on finite element analysis is performing steady analysis or non-stability analysis. In the steady analysis, the shapes before and after deformation are tentatively determined and the shapes are fine-tuned to achieve calculation stability. In the non-stability analysis, the tip of the workpiece is completely expanded. For example, simulation by the two-dimensional finite element method using the dynamic explicit method can be preferably used. As a code necessary for analysis, for example, ABAQUS, which is a commercial analysis code, can be preferably used. However, the static implicit method is not negated.

In both the steady analysis and the non-stability analysis, evaluation is performed on the basis of the result when the tip of the workpiece has advanced 1.0 m or more after passing through the shoulder portion adjacent to the taper portion of the tool. The reason is that, in calculation, processing itself is not stable until a certain length has passed through the tool. In actual processing, when tube expanding processing is performed from the tip, there is no restraining part in the vicinity of the tip in the direction in which the material advances, and thus the values of the external diameter and thickness are different from those of middle part. Given this, the above-mentioned conditions should be used. However, depending on the analysis conditions, evaluation does not necessarily have to be performed on the basis of the shape after the tip has advanced by the distance of 1.0 m or more or after a time corresponding to this has elapsed. The distance 1.0 m or more is a limitation that can be universally applied to many conditions. Preferably, the distance is 1.4 m or more.

At this step, as a result, the calculated load, the external diameter after processing, the thickness after processing, and the internal diameter after processing are obtained.

Next, step (e) determines whether or not the calculated load is less than or equal to the upper load. If the determination result is Yes, step (f) is proceeded to. If it is No, the thickness of the hollow piece, or the thickness of the hollow piece and the angle of the taper portion of the tool are changed, and step (c) is returned to.

It is necessary that the calculated load does not exceed the upper load (machining ability of equipment). If the calculated load substantially exceeds machining ability of the equipment, a change that the thickness of the hollow piece is reduced, and then the taper angle is reduced, is performed in this order and then simulation is performed again. Since reducing the thickness reduces the cross-sectional area, the calculated load necessary for processing can be reduced. Reducing the taper angle reduces the resistance during processing. If such facility requirements are satisfied, step (f) is proceeded to.

In step (f), it is determined whether or not the external diameter after processing is within the range of the target external diameter ±1% and the thickness after processing is within the range of the target thickness ±7.5%. If the determination result is Yes, step (g) is proceeded to. If it is No, the external diameter of the hollow piece and/or the thickness of the hollow piece are changed, and step (c) is returned to.

Step (f) determines whether or not the deviation from the target size of the product (=(the size after processing-the target size)/the target size*100(%)) is within the threshold value. The threshold value of the external diameter is ±1%, and the threshold value of the thickness is ±7.5%. The threshold values (±1%, ±7.5%) of the outside diameter deviation and the thickness deviation were determined in consideration of the size tolerance of the actual product. If the determination result is Yes, step (g) is proceeded to. If it is No, so that the deviation falls within the threshold value, the external diameter of the hollow piece and/or the thickness of the hollow piece are changed, and simulation is repeated.

Finally, step (g) determines whether or not the internal gap=the internal diameter after processing-the maximum diameter of the tool is 1 mm or less. If the determination result is Yes, the size parameters at this time are determined to be size parameters for actual tube expanding manufacturing, and the procedure is ended. If it is No, the shoulder portion R and/or the taper angle is changed, and step (d) is returned to.

When the determination result is No, the final shape can be obtained more easily by performing changes as follows. If the thickness after processing is almost equal to the target thickness, the shoulder portion R is preferentially changed. If the thickness after processing is large and the internal diameter after processing is large, the angle of the taper portion is changed. If the shoulder portion R is increased, the taper portion is gradually continuous with the parallel portion (the maximum diameter portion of the tool). Then, the workpiece can be deformed to conform to the tool, even when the workpiece is processed while being pressed in (or drawn out). Thus, the internal diameter can be changed with little change in thickness and the like. Of course, if both thickness and internal diameter are large, the angle of the taper portion is slightly reduced and simulation is performed again, and calculation is repeated by the above-mentioned procedure.

EXAMPLES

Example 1

As an analysis object product, STPA24 (low-alloy boiler steel; seamless steel pipe) having an external diameter of 609.6 mm and a thickness of 24.1 mm was used.

Since the external diameter of the product was about 600 mm, the initial value of the external diameter of the hollow piece was 406.4 mm, which was the external diameter of an easily-available large-diameter seamless steel pipe, and the initial value of the thickness of the hollow piece was 25 mm, which was almost equal to the thickness of the product. On the assumption that to reduce the manufacturing energy heating was performed to about 900° C. by induction heating in the vicinity of the processed part (the taper portion of the tool), the maximum diameter of the tool was set to 562 mm considering the external diameter of the product and the thickness of the product. The frictional coefficient between the tool and the inside surface of the tube was set to 0.1 on the premise that lubricant agent or lubrication was applied before processing. The upper load that is the upper limit of feed power of the tube expanding processing apparatus to be used was assumed to be 800 tonf.

The length of the taper portion was 1200 mm, and the taper angle=arctan (((the maximum diameter of the tool-the internal diameter of the hollow piece)/2)/the length of the taper portion)≈6 degrees. The internal diameter of the hollow piece=the external diameter of the hollow piece-2*the thickness of the hollow piece. The taper angle may be set to a larger value. However, the larger the taper angle, the higher the resistance to the workpiece, and it is obvious that more manufacturing energy is required. Thus, considering the machine specification of the processing machine, analysis was started from the low value of the taper angle. The initial value of the shoulder portion R was R200, which is about ½ of the external diameter of the hollow piece.

As mentioned above, the thickness of the hollow piece was set to 25 mm. Thus, to divide the workpiece into elements whose size in the thickness direction is 5 mm or less, division into at least five is necessary. Since there is a possibility that a smaller thickness is assumed, the thickness of the workpiece was divided into nine. As mentioned above, the length of the processed part (taper portion) was 1200 mm. Thus, to make the element size in this length direction equal to or about twice that in the thickness direction, the length of the processed part was divided into 300. The parts other than the processed part are divided in the same manner as the processed part.

Tube expanding simulation was performed on the assumption that the circumferential direction of tube was uniform. The shape was set on the assumption that in the early stage, the tube was deformed slightly larger than the tool. Tube expanding simulation was performed on the assumption that deformation progressed from here, by the two-dimensional finite element method using the dynamic explicit method. ABAQUS, which is a commercial analysis code, was used as a code necessary for analysis.

Figure 2:
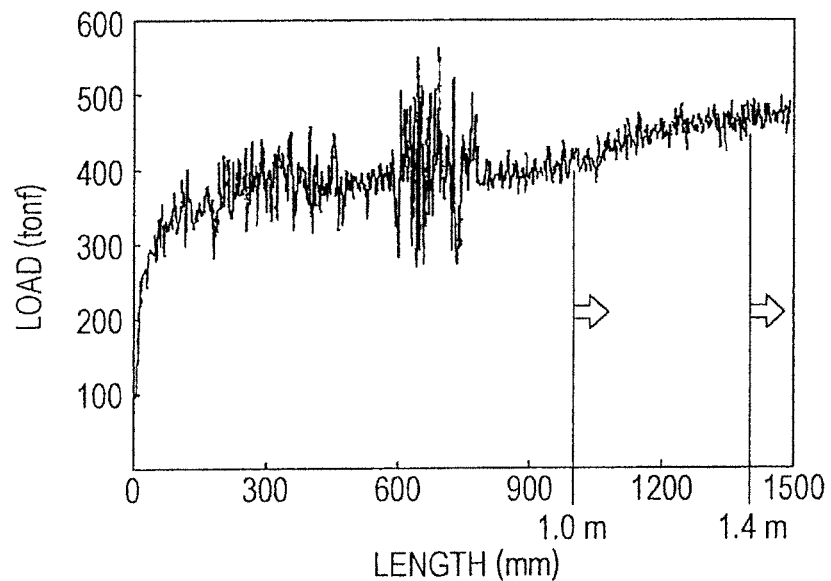
FIG. 2 is a diagram showing changes in calculated load as an example of simulation result.

Simulation was started. When the tip of the workpiece was deemed to have advanced 1.0 in or more after passing through the shoulder portion, the calculated load and the deformed state (the size after processing) were evaluated. As shown in FIG. 2, after the length from the shoulder portion to the tip of the workpiece had become 1.0 in or more, the load stabilized gradually, and when the length was 1.4 m or more, the load was stable at about 480 tonf. Since this value is sufficiently smaller than the upper load 800 tonf, tube expanding processing can be performed without problems. The size after processing obtained here is: external diameter=612.6 mm, and thickness=22.75 mm. Compared to the target size, the external diameter is large, and the thickness is small.

Figure 3:
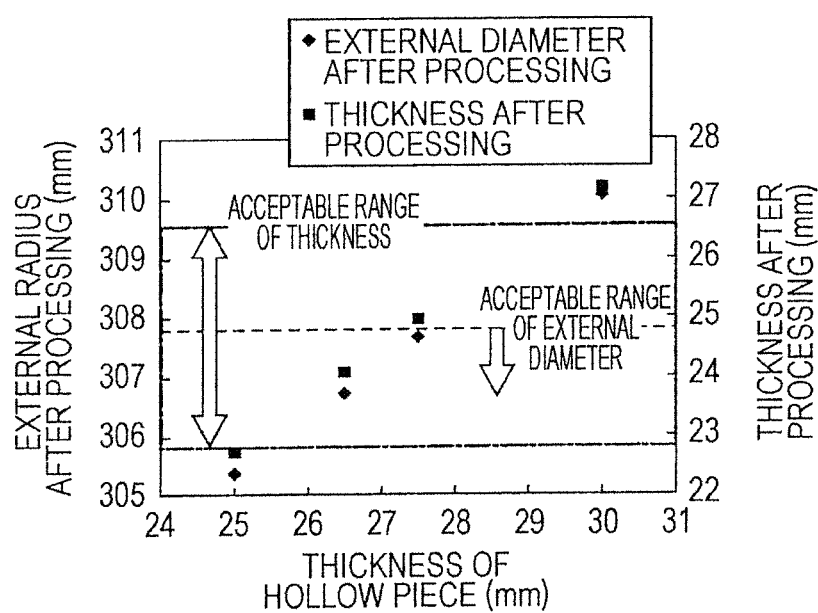
FIG. 3 is a diagram showing the size after processing as an example of simulation result.

So, the thickness of the hollow piece was gradually changed and simulation was carried out in several ways. The result is shown in FIG. 3. In the figure, an acceptable range of external diameter where the external diameter is within the threshold value (±1%) of the deviation of the external diameter, and an acceptable range of thickness where the thickness is within the threshold value (±7.5%) of the deviation of the thickness are shown. These show that the appropriate thickness of the hollow piece is 25.5 to 27.5 mm. Next, in this region, the simulation result was evaluated on the internal gap. The shoulder portion R was changed to R=800 mm, which is almost twice the external diameter of the hollow piece. As a result, it was confirmed that when R=300 mm, the internal gap was 2.01 mm; when R=400 mm, the internal gap was 1.62 mm; and when R=600 mm or more, an internal gap of 1.0 mm or less was able to be achieved.

As mentioned above, it was confirmed that tube expanding processing conditions having many levels were able to be appropriately set under relatively few simulation conditions.

These are tabulated in Table 1.

Example 2

Experiments comparing the simulation result obtained in EXAMPLE 1 with the case of actual tube expanding processing and verifying the effectiveness of our methods were conducted. In the experiments, a small extrusion apparatus was used, and the model ratio thereof was 1/5. To avoid disturbance such as temperature, a lead tube was used as a workpiece, and tube expanding processing was performed without using heat. The sizes of the workpiece and tool are 1/5 of those in EXAMPLE 1.

Experimental result is shown in Case A of Table 2, and simulation result is shown in Case B of the table. From Table 2, the experimental result generally shows values similar to the simulation result, and the effectiveness of our methods was verified.

TABLE 1

| | Hollow piece shape | | Tool shape | | | Simulation result | | | | |
|---|---|---|---|---|---|---|---|---|---|---|
| Case | External diameter (mm) | Thickness (mm) | Maximum diameter of tool (mm) | Taper angle (deg) | Shoulder portion R (mm) | External radius (mm) | Internal radius (mm) | Thickness (mm) | Internal gap (mm) | Load (tonf) |
| 1 | 406.4 | 25.0 | 562 | 6 | 200 | 306.314 | 283.568 | 22.746 | 2.568 | 480 |
| 2 | 406.4 | 25.0 | 562 | 6 | 300 | 305.802 | 283.092 | 22.710 | 2.092 | 480 |
| 3 | 406.4 | 25.0 | 562 | 6 | 400 | 305.356 | 282.617 | 22.739 | 1.617 | 500 |
| 4 | 406.4 | 25.0 | 562 | 6 | 600 | 304.615 | 281.893 | 22.722 | 0.752 | 510 |
| 5 | 406.4 | 25.0 | 562 | 10 | 400 | 304.199 | 281.905 | 22.294 | 0.905 | 500 |
| 6 | 406.4 | 25.0 | 562 | 10 | 600 | 303.924 | 281.620 | 22.304 | 0.284 | 515 |
| 7 | 406.4 | 27.5 | 562 | 6 | 400 | 307.693 | 282.771 | 24.922 | 1.771 | 550 |
| 8 | 406.4 | 30.0 | 562 | 6 | 400 | 310.087 | 282.931 | 27.156 | 1.931 | 600 |
| 9 | 406.4 | 26.5 | 562 | 6 | 400 | 306.723 | 282.707 | 24.016 | 1.707 | 525 |

TABLE 2

| | Hollow piece shape | | Tool shape | | | Result | | | | |
|---|---|---|---|---|---|---|---|---|---|---|
| Case | External diameter (mm) | Thickness (mm) | Maximum diameter of tool (mm) | Taper angle (deg) | Shoulder portion R (mm) | External radius (mm) | Internal radius (mm) | Thickness (mm) | Internal gap (mm) | Load (tonf) |
| A | 81.3 | 53 | 112.4 | 6 | 120 | 61.11 | 56.30 | 4.81 | 0.10 | 20.9 |
| B | 406.5 | 26.5 | 562 | 6 | 600 | 305.657 | 281.701 | 24.192 | 0.70 | 522.5 |

The invention claimed is:

1. A tube expanding method for manufacturing a metal tube comprising providing an internal processing tool having a mandrel, a taper portion, a shoulder portion, and a parallel portion that are smoothly connected each other in this order from a starting end that is a minimum diameter end of the tool to a terminal end that is a maximum diameter end of the tool, feeding a metal tube that is a workpiece whose hollow piece internal diameter is smaller than the maximum diameter of the tool, the starting end side of the tool being used as an entrance side such that an internal diameter side of the tube is caused to pass around the tool, and thereby the workpiece undergoes tube expanding processing, and determining a size of the hollow piece that is the workpiece before tube expanding processing and a size of the tool by a tube expanding processing simulation based on finite element analysis comprising:

(a) setting a target external diameter and a target thickness of a product, a length of the taper portion of the tool, and an upper load that is the upper limit of feed power of a tube expanding processing apparatus to be used;

(b) setting, as size parameters, an external diameter of the hollow piece, a thickness of the hollow piece, a taper angle that is a taper angle of the taper portion of the tool, a shoulder portion R that is a radius of curvature of the shoulder portion in the axial section of the tool, and the maximum diameter of the tool that is the diameter of the parallel portion of the tool;

(c) dividing the workpiece into a plurality of elements;

(d) performing tube expanding processing simulation, and a calculated load that is a calculated feed power, and an external diameter after processing, a thickness after processing, and an internal diameter after processing of the workpiece when a tip of the workpiece has advanced by 1.0 m or more from the shoulder portion position toward a tool exit side are obtained;

(e) determining whether or not the calculated load is less than or equal to the upper load; if the determination result is Yes, step (f) is proceeded to; if it is No, the thickness of the hollow piece, or the thickness of the hollow piece and the taper angle are changed, and step (c) is returned to;

(f) determining whether or not the external diameter after processing is within a range of the target external diameter ±1% and the thickness after processing is within a range of the target thickness ±7.5%; if the determination result is Yes, step (g) is proceeded to; if it is No, the external diameter of the hollow piece and/or the thickness of the hollow piece is changed, and step (c) is returned to; and (g) determining whether or not an internal gap=the internal diameter after processing−the maximum diameter of the tool is 1 mm or less; if the determination result is Yes, the size parameters at this time are determined to be size parameters for actual tube expanding manufacturing, and the procedure is ended; if it is No, the shoulder portion R and/or the taper angle is changed, and step (c), (d) is returned to.

2. The method according to claim 1, wherein, while the internal diameter side of the tube is caused to pass through the tool, from part of the workpiece passing through the taper portion is heated from the external diameter side.

3. The method according to claim 1, wherein the hollow piece is a seamless tube.

4. The method according to claim 1, wherein the tube expanding processing simulation is performed by a two-dimensional finite element method with a dynamic explicit method.

5. The method according to claim 2, wherein the hollow piece is a seamless tube.

6. The method according to claim 2, wherein the tube expanding processing simulation is performed by a two-dimensional finite element method with a dynamic explicit method.

7. The method according to claim 3, wherein the tube expanding processing simulation is performed by a two-dimensional finite element method with a dynamic explicit method.

8. The method according to claim 5, wherein the tube expanding processing simulation is performed by a two-dimensional finite element method with a dynamic explicit method.

* * * * *

UNITED STATES PATENT AND TRADEMARK OFFICE
CERTIFICATE OF CORRECTION

PATENT NO. : 9,707,614 B2
APPLICATION NO. : 14/404241
DATED : July 18, 2017
INVENTOR(S) : Katsumura et al.

It is certified that error appears in the above-identified patent and that said Letters Patent is hereby corrected as shown below:

In Column 6

At Line 32, please insert -- ≈ -- after "tool", and at Line 37, please insert -- ≈ -- after "R".

Signed and Sealed this
Twenty-eighth Day of November, 2017

Joseph Matal
*Performing the Functions and Duties of the
Under Secretary of Commerce for Intellectual Property and
Director of the United States Patent and Trademark Office*